(12) United States Patent
Hosokawa

(10) Patent No.: US 6,252,431 B1
(45) Date of Patent: Jun. 26, 2001

(54) SHARED PMOS SENSE AMPLIFIER

(75) Inventor: Kohji Hosokawa, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/636,475

(22) Filed: Aug. 10, 2000

(30) Foreign Application Priority Data

Aug. 30, 1999 (JP) .................................. 11-242966

(51) Int. Cl.[7] .................................................. G11C 7/06
(52) U.S. Cl. ........................................... 327/57; 365/205
(58) Field of Search .................................. 365/205, 207, 365/203; 327/51–57

(56) References Cited

U.S. PATENT DOCUMENTS

| | | | |
|---|---|---|---|
| 5,412,605 | * 5/1995 | Ooishi | 365/205 |
| 5,566,116 | * 10/1996 | Kang | 365/205 |
| 5,731,718 | * 3/1998 | Rieger | 327/57 |
| 5,949,729 | * 9/1999 | Suyama et al. | 365/205 |
| 5,970,007 | * 10/1999 | Shiratake | 365/207 |

* cited by examiner

Primary Examiner—Toan Tran
(74) Attorney, Agent, or Firm—Robert A. Walsh

(57) ABSTRACT

In a sense amplifier for detecting and amplifying a potential difference between a pair of signal lines (BM(BL), /BM(/BL)), a first pull-down circuit (N20, N21), a pull-up circuit (P10, P11), and a second pull-down circuit (N28, N29) are disposed in the recited order between the pair of signal lines. The pull-up circuit (P10, P11) includes a pair of p-type FETs (P10, P11) which configure a flip-flop, and the sources of the pair of p-type FETs are both connected directly to a first constant-voltage source (Vd).

5 Claims, 4 Drawing Sheets

SHARED PMOS SENSE AMPLIFIER

FIELD OF THE INVENTION

This invention relates generally to sense amplifiers for detecting and amplifying a potential difference between a pair of signal lines, and more particularly to dynamic random-access memory (DRAM) bit line sense amplifiers for detecting and amplifying a very small potential difference (signal) between a pair of signal lines to which a DRAM cell is connected.

BACKGROUND OF THE INVENTION

In conventional DRAM sense amplifiers, a so-called "Vd/2 (where Vd=power-source voltage)" pre-charging circuit consisting of reflected bit lines, which employs complementary metal-oxide-semiconductor (CMOS) sense amplifiers, from the viewpoint of densification, noise tolerance or low power characteristics, is widely used.

FIG. 1 shows the construction of the conventional "Vd/2" pre-charging circuit. Note that in the figure, column-selecting gates are omitted because they are unnecessary in explaining the "Vd/2" pre-charging circuit. CMOS sense amplifiers (N1, P1, N2, P2) connected to sense-amplifier nodes (BM, /BM) are disposed in the central portion of the "Vd/2" pre-charging circuit. The sense-amplifier nodes (BM, /BM) are connected to left and right bit lines (BLl, /BLl, BLr, /BLr) through n-channel MOS (NMOS) isolators (N3, N4, N5, N6). By these NMOS solators (N3, N4, N5, N6), the CMOS sense amplifiers (N1, P1, N2, P2) are isolated from left and right DRAM cell arrays connected to the bit lines (BLl, /BLl, BLr, /BLr).

The circuit of FIG. 1 has pre-charging circuits (N10, N11, N12, N13) for pre-charging the bit lines and equalizer circuits (N8, N9) for equalizing electric potentials on the bit lines, outside the NMOS isolators (N3, N4, N5, N6). Also, an NMOS set driver (N7) is connected as a common driver to the sources of the NMOSs (N1, N2) of the plurality of CMOS sense amplifiers. Similarly, a p-channel MOS (PMOS) set driver (P3) is connected as a common driver to the sources of the PMOSs (P1, P2) of the plurality of CMOS sense amplifiers. The NMOS set driver (N7) is connected to ground, while the PMOS set driver (P3) is connected to a constant-voltage source (Vd).

FIG. 2 shows a timing diagram of the circuit of FIG. 1. The operation of the conventional circuit of FIG. 1 will hereinafter be described with reference to FIGS. 1 and 2. Pre-charge signals (PRl, PRr) both hold a logic high level during pre-charging or non-selection. The NMOS transistors (N7 to N12) are all switched on (conduction), so that all the bit line pairs are pre-charged to Vd/2. Isolation-controlling signals (ISOl, IOSr) hold a logic high level. Therefore, the NMOS isolators (N3, N4, N5, N6) are all switched on (conduction), and at the same time, the sense amplifier nodes (BM, /BM) are also pre-charged. At this time, an n-channel set signal NSET is low and the NMOS set driver (N7) is in an OFF (non-conduction) state. A p-channel set signal PSET is high and the PMOS set driver (P3) is in an OFF (non-conduction) state.

Assuming the left side cell array of FIG. 1 has just been activated, the pre-charge signal (PRl) goes low. The NMOSs (N10, N11) of the left side pre-charge circuit is switched off and pre-charging of the left side bit line pair (BLl, /BLl) ends. At the same time, the isolation-controlling signal (IOSr) goes low. The NMOS isolators (N5, N6) are switched off and therefore the right side bit line pair (BLr, /BLr) is isolated from the CMOS sense amplifier. After data on a cell has appeared on the bit lines (BLl, /BLl), the n-channel set signal NSET is made high and the p-channel set signal PSET is made low. The NMOS set driver (N7) and the PMOS set driver (P3) are both conducted (ON) and the potential difference (cell data) between the bit line pair (BLl, /BLl) is amplified by the CMOS sense amplifier. After the bit line pair (BLl, /BLl) has reached voltage levels of ground (Gnd) and Vd, pre-charging operation is again performed and a sequence of operations ends. The operation of the right side cell array will be performed in the same as the left side cell array.

The conventional circuit of FIG. 1, however, has the disadvantage that the amplification of the high (Vd) side of the sense amplifier and the rewriting of high data to a cell take time from the circuit construction. That is, the circuit of FIG. 1 has the disadvantage that a long time is required until the bit line (BLl) reaches a voltage level of Vd during amplification of the sense amplifier, as shown in FIG. 2 (upper waveform). The reason is that since the bit line (BLl) is charged by the PMOS set driver (P3) disposed after a lot of sense amplifiers connected in parallel through the NMOS isolator (N3) and the PMOS (P1) of the sense amplifier, the current driving force for transistors (N3, P1, P3) connected in series is insufficient with respect to the total bit line load. The high-speed operation of the transistors (N3, P1, P3) cannot be ensured and therefore it takes a long time to supply current (power) from the Vd power source to the bit line (BLl).

SUMMARY OF THE INVENTION

The object of the present invention is to provide a sense amplifier that renders high-speed amplification and high-speed rewriting possible with a slight increase in the layout area, without losing the advantages of the conventional "Vd/2" pre-charging circuit.

Another object of the present invention is to speed up the cycle time of a DRAM by a sense amplifier which makes high-speed amplification and high-speed rewriting possible.

The present invention provides a sense amplifier for detecting and amplifying a potential difference between a pair of signal lines (BM(BL), /BM(/BL)), the sense amplifier comprising:

a first pull-down circuit (N20, N21), a pull-up circuit (P10, P11), and a second pull-down circuit (N28, N29) disposed in the recited order between the pair of signal lines;

wherein the pull-up circuit (P10, P11) includes a pair of p-type FETs (P10, P11) which constitute a flip-flop, and the sources of the pair of p-type FETs are both connected directly to a first constant-voltage source (Vd).

DESCRIPTION OF THE PREFERRED EMBODIMENT

Although the following description is made of an embodiment employing MOS transistors, the present invention is not limited to this embodiment, however, it is applicable to other embodiments that employ switching elements such as field effect transistors (FETs) and the like.

Figure 3:
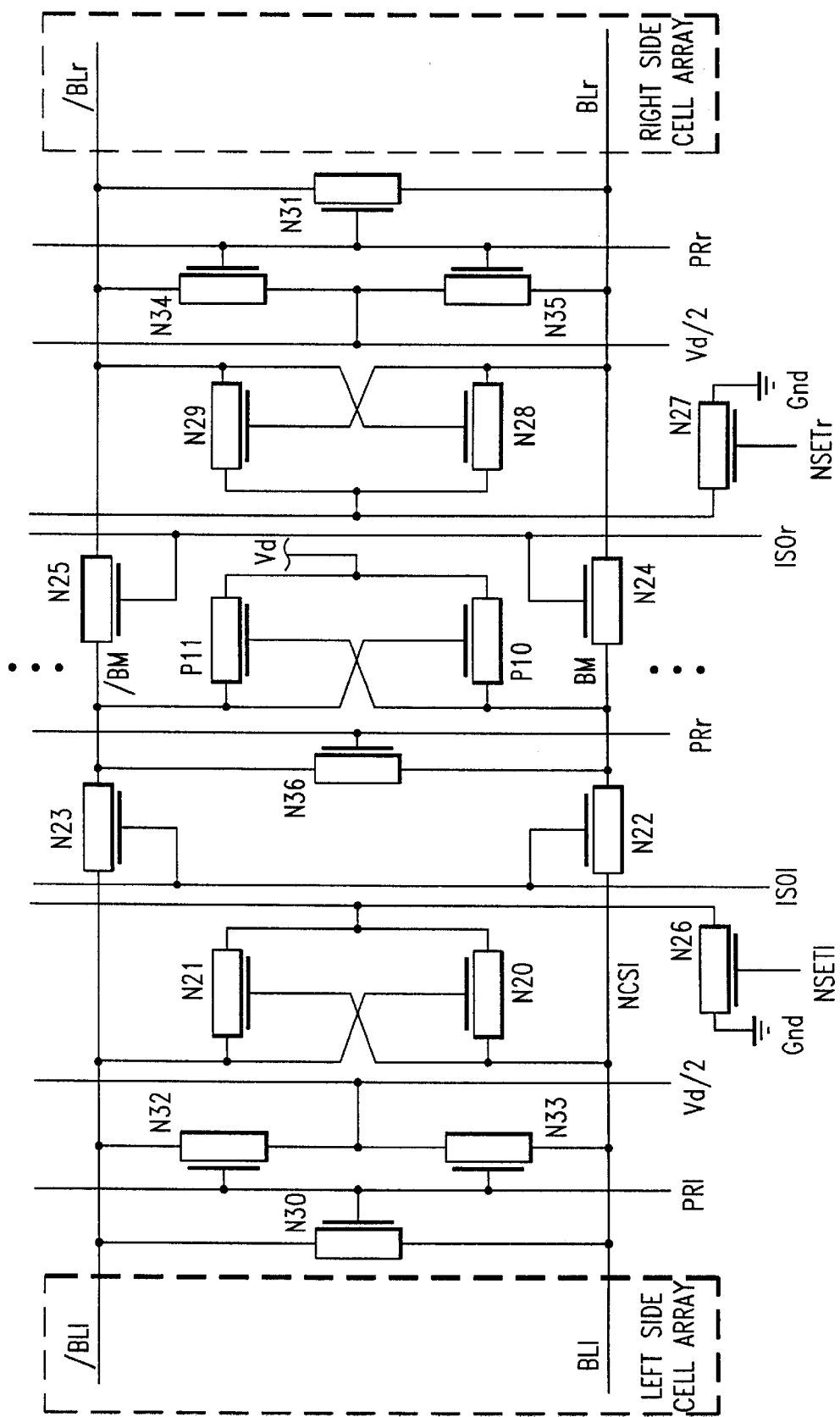
FIG. 3 is a circuit diagram showing an embodiment of the sense amplifier of the present invention.

FIG. 3 shows an embodiment of the sense amplifier of the present invention. Column-selecting gates are omitted in FIG. 3 because they are unnecessary in explaining the sense amplifier of the present invention. In the central portion, PMOS sense amplifiers (P10, P11), which form a common pull-up circuit, are disposed and connected to sense-amplifier nodes (BM, /BM). The sources of the PMOS sense amplifiers (P10, P11) are connected directly to a constant-voltage source Vd. An NMOS sense-amplifier equalizer (N36) for equalizing electric potentials on the sense-amplifier nodes (BM, /BM) is provided next to the PMOS sense amplifiers (P10, P11). The sense-amplifier nodes (BM, /BM) are connected to left and right bit lines (BLl, /BLl, BLr, /BLr) through NMOS isolators (N22, N23, N24, N25). Next to (or outside) the NMOS isolators (N22, N23, N24, N25), there are NMOS sense amplifiers (N20, N21), (N28, N29) which form left and right pull-down circuits. By the NMOS isolators (N22, N23), (N24, N25), the PMOS sense amplifiers (P10, P11) are isolated from the DRAM cell array and NMOS sense amplifiers (N20, N21), (N28, N29) connected to the bit lines (BLl, /BLl, BLr, /BLr).

The circuit of FIG. 3 has pre-charging circuits (N32, N33), (N34, N35) for pre-charging the bit lines and equalizer circuits (N30, N31) for equalizing electric potentials on the bit lines, outside the NMOS sense amplifiers (N20, N21), (N28, N29). Also, NMOS set drivers (N26, N27) are connected as common drivers to the sources of the NMOS sense amplifiers (N20, N21), (N28, N29). In FIG. 3, there is no PMOS set driver, unlike the conventional circuit of FIG. 1. The NMOS set drivers (N26, N27) are connected to ground.

Figure 1:
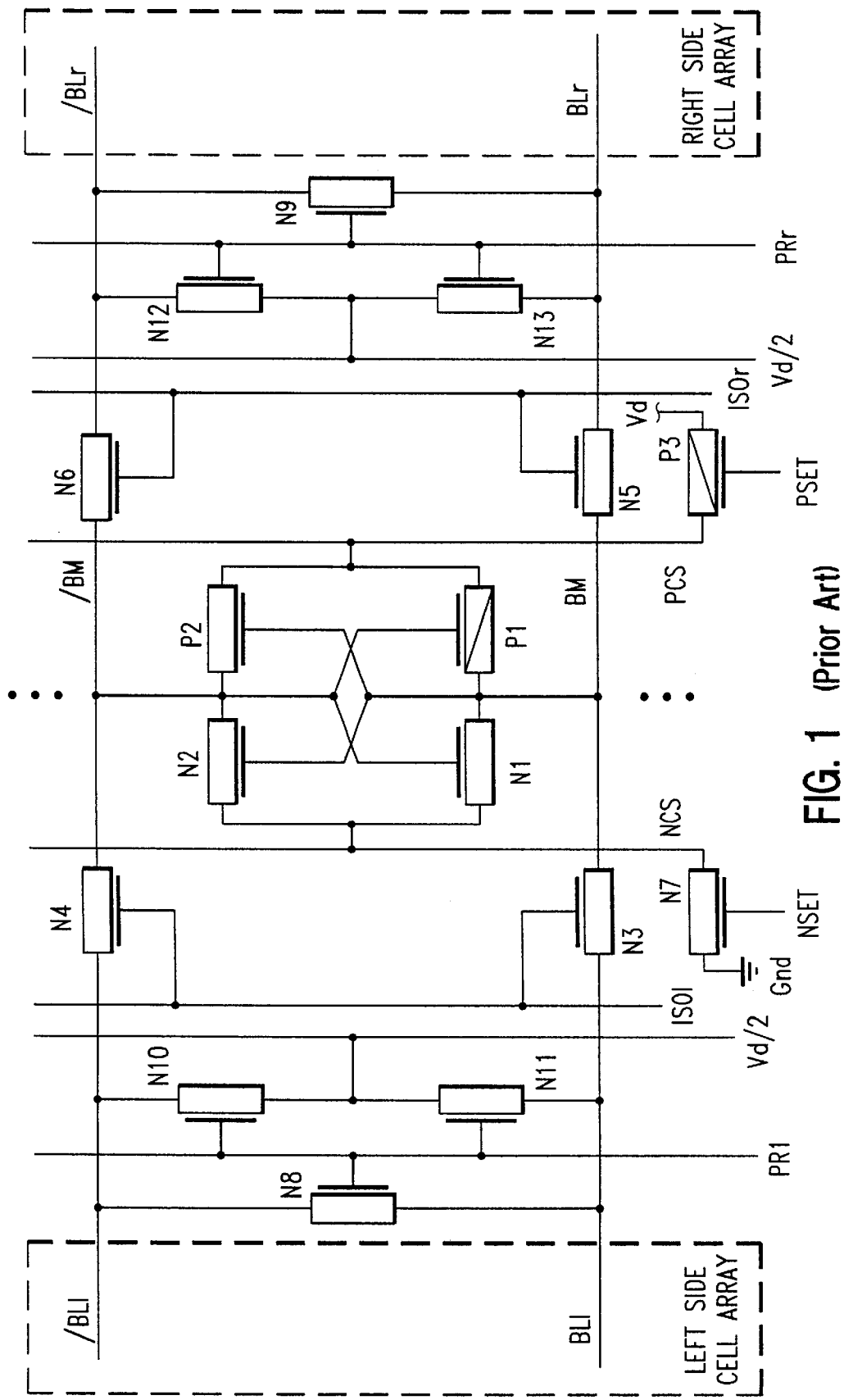
FIG. 1 is a circuit diagram showing the construction of a conventional "Vd/2" pre-charging circuit.

The difference between the construction of the present invention of FIG. 3 and the conventional construction of FIG. 1 is:

(1) to provide the NMOS sense amplifiers (N20, N21), (N28, N29), which form left and right pull-down circuits, and the left and right NMOS set drivers (N26, N27);

(2) to provide the NMOS sense-amplifier equalizer (N36) between the sense-amplifier nodes (BM, /BM); and (3) to delete the PMOS set driver and connect the sources of the PMOS sense amplifiers (P10, P11) directly to the constant-voltage source Vd.

Figure 4:
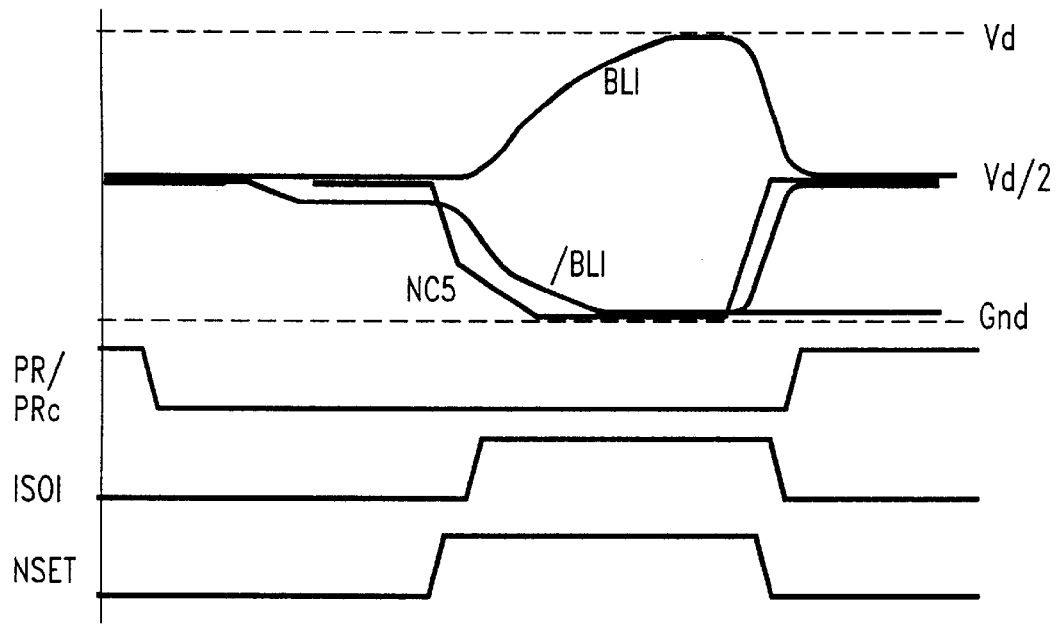
FIG. 4 shows a timing diagram used to explain the circuit of the present invention of FIG. 3.

FIG. 4 shows a timing diagram of the circuit of FIG. 3. The operation of the circuit of FIG. 3 will hereinafter be described with reference to FIGS. 3 and 4. Pre-charge signals (PRl, PRr) both hold a logic high level during pre-charging. The NMOS transistors (N32 to N35) are all switched on (conduction), so that all the bit line pairs are pre-charged to Vd/2. An equalizer signal (PRc) holds a logic high level and therefore the PMOS sense-amplifier nodes (BM, /BM) are also equalized. At this time, isolation-controlling signals (ISOl, ISOr) hold a logic low level and the NMOS isolators (N22, N23), (N24, N25) are switched off (non-conduction). The PMOS sense amplifiers (P10, P11) are isolated from the left and right NMOS sense amplifiers (N20, N21), (N28, N29).

Figure 2:
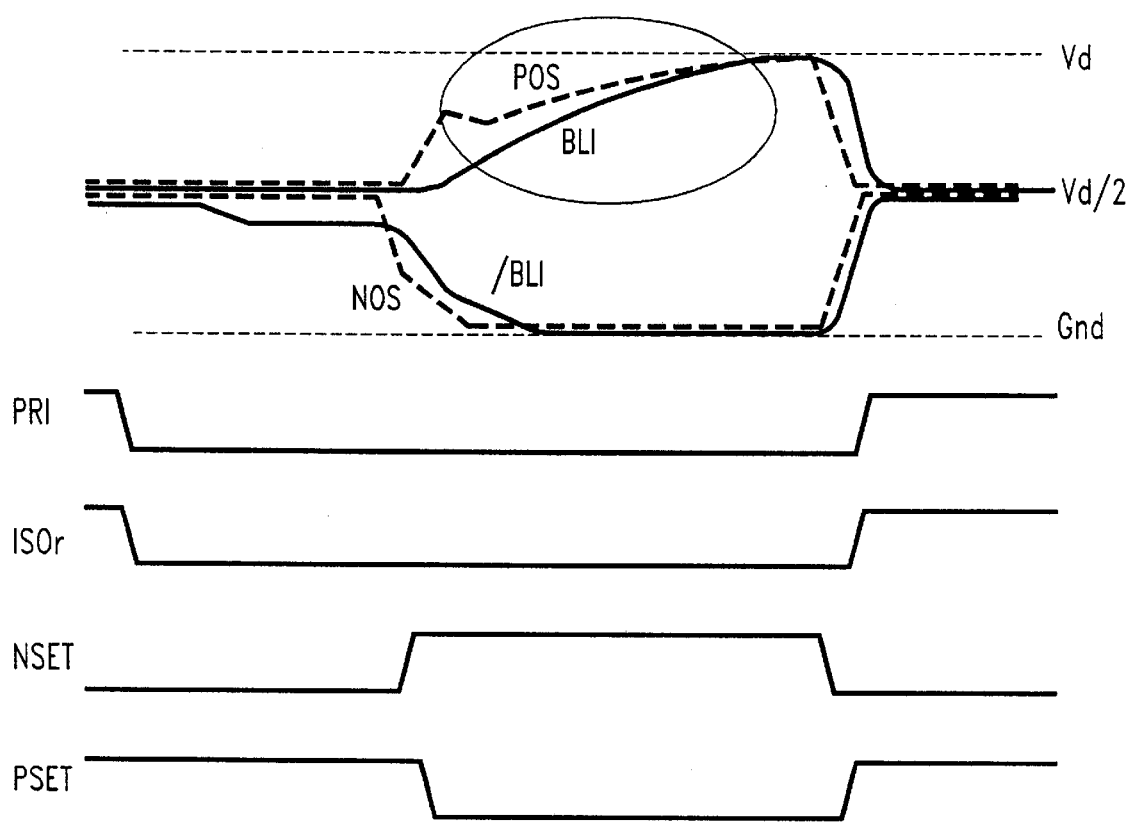
FIG. 2 shows a timing diagram used for explaining the conventional circuit of FIG. 1.

Assuming that the left side cell array of FIG. 3 has just been activated, the pre-charge signal (PRl) goes low. The NMOSs (N32, N33) of the left side pre-charge circuit are switched off and pre-charging of the left side bit line pair (BLl, /BLl) ends. After data on a cell has appeared on the bit lines (BLl, /BLl), the n-channel set signal (NSET) is made high, whereby the left side NMOS set driver (N26) is conducted and the NMOS sense amplifiers (N20, N21) start amplifying the potential difference (cell data) between the bit line pair (BLl, /BLl). After this start of amplification, the isolation-controlling signal (ISOl) is made high, whereby the NMOS isolators (N22, N23) are conducted and starts rewriting of the "high" levels of the bit lines (BLl, /BLl). The "high" voltage level of the isolation-controlling signal (ISOl) is a high voltage boosted in the same way as the conventional method. After the bit line pair (BLl, /BLl) has reached voltage levels of ground (Gnd) and Vd, pre-charging operation is again performed and a sequence of operations ends. The operation of the right side cell array will be performed in the same as the left side cell array. The essential difference in timing control between the circuit of FIG. 3 and the conventional circuit of FIG. 1 is a timing difference between the isolation-controlling signals (ISOl and IOSr) as will be seen from FIGS. 2 and 4.

Figure 5:
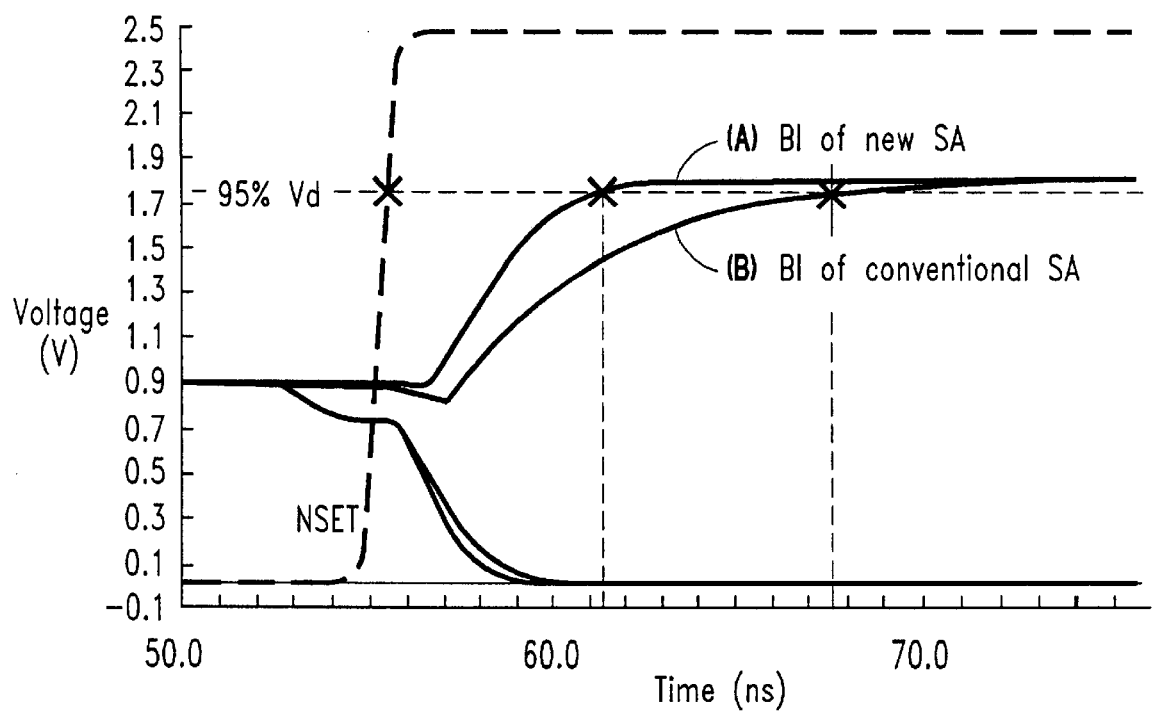
FIG. 5 is a diagram showing the simulation result of the operation of the sense amplifier of the present invention.

FIG. 5 shows the simulation result of the operation of the sense amplifier of the present invention. In FIG. 5, there are simulation results of variations in the electric potential on the bit line (cell output) obtained after the n-channel set signal (NSET) of the NMOS set drivers (N26, N27) has been made on (high). Now consider the time it takes an electric potential on the bit line (cell output) to go from the ON state of the set signal (NSET) to 95 percent of the power-source voltage Vd, as shown in FIG. 5 the conventional method (B) takes about 12 ns, while the new method (A) of the present invention takes about 6 ns. Thus, speed has been improved by approximately 50 percent. The enhancement in the driving speed in the present invention is achieved mainly by deleting the conventional PMOS set driver (P3 in FIG. 1) and connecting the sources of the PMOS sense amplifiers (P10, P11) directly to the dc power source (Vd).

The method of the present invention requires twice as many NMOS sense amplifiers, compared with the conventional method. However, since the NMOS sense amplifier is directly connected to the bit line pair without any NMOS isolator, the size of the NMOS transistor can be reduced while holding the same driving force with respect to the bit line. Therefore, if the layout areas of the circuits are compared, the sense amplifier circuit according to the present invention can be suppressed to an increase of approximately 5 percent, compared with the conventional sense amplifier circuit. Therefore, in the sense amplifier of the present invention, high-speed amplification and high-speed rewriting become possible with a slight increase in the layout area. As a result, the cycle time for a DRAM can be sped up.

While the invention has been particularly shown and described with respect to illustrative and performed embodiments thereof, it will be understood by those skilled in the art that the foregoing and other changes in form and details may be made therein without departing from the spirit and scope of the invention which should be limited only by the scope of the appended claims.

What is claimed is:

1. A sense amplifier for detecting and amplifying a potential difference between a pair of signal lines, the sense amplifier comprising:

a first pull-down circuit, a pull-up circuit, and a second pull-down circuit disposed in the recited order between said pair of signal lines;

wherein said pull-up circuit includes a pair of p-type field effect transistors (FETs) which compose a flip-flop, and the sources of said pair of p-type FETs are both connected directly to a first constant-voltage source.

2. The sense amplifier according to claim 1, further comprising:

a first transfer gate circuit disposed between said first pull-down circuit and said pull-up circuit; and a second transfer gate circuit disposed between said pull-up circuit and said second pull-down circuit.

3. The sense amplifier according to claim 2, further comprising an equalizer for equalizing electric potentials between said pair of signal lines, wherein said equalizer is disposed either between said first transfer gate circuit and said pull-up circuit or between said second transfer gate circuit and said pull-up circuit.

4. The sense amplifier according to claim 3, further comprising a pre-charging circuit for pre-charging said pair of signal lines, wherein said pair of signal lines is connected through said first transfer gate circuit to a first pair of bit lines to which a memory cell is connected, and is also connected through said second transfer gate circuit to a second pair of bit lines to which a memory cell is connected.

5. The sense amplifier according to claim 4, wherein said first pull-down circuit includes a first pair of n-type FETs which constitute a flip-flop, the sources of said first pair of n-type FETs being connected to a second constant-voltage source through a first n-type FET set driver;

said second pull-down circuit includes a second pair of n-type FETs which constitute a flip-flop, the sources of said second pair of n-type FETs being connected to said second constant-voltage source through a second n-type FET set driver;

said first transfer gate circuit has third and fourth n-type FETs, the drain of said third n-type FET being connected to one of said pair of signal lines, the source of said third n-type FET being connected to one of said first pair of bit lines, the drain of said fourth n-type FET being connected to the other of said pair of signal lines, and the source of said fourth n-type FET being connected to the other of said first pair of bit lines; and said second transfer gate circuit has fifth and sixth n-type FETs, the drain of said fifth n-type FET being connected to one of said pair of signal lines, the source of said fifth n-type FET being connected to one of said second pair of bit lines, the drain of said sixth n-type FET being connected to the other of said pair of signal lines, and the source of said sixth n-type FET being connected to the other of said second pair of bit lines.

\* \* \* \* \*